United States Patent
Matsuo et al.

(10) Patent No.: US 10,115,840 B2
(45) Date of Patent: *Oct. 30, 2018

(54) SOLAR CELL AND METHOD FOR PRODUCING THEREOF

(71) Applicant: SHIN-ETSU CHEMICAL CO., LTD., Tokyo (JP)

(72) Inventors: Yoko Matsuo, Takasaki (JP); Takenori Watabe, Annaka (JP); Hiroyuki Otsuka, Karuizawa-machi (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/503,894

(22) PCT Filed: Jul. 2, 2015

(86) PCT No.: PCT/JP2015/003326
§ 371 (c)(1),
(2) Date: Feb. 14, 2017

(87) PCT Pub. No.: WO2016/051628
PCT Pub. Date: Apr. 7, 2016

(65) Prior Publication Data
US 2017/0170338 A1    Jun. 15, 2017

(30) Foreign Application Priority Data
Sep. 30, 2014   (JP) ................................. 2014-201269

(51) Int. Cl.
*H01L 31/00*   (2006.01)
*H01L 31/02*   (2006.01)
(Continued)

(52) U.S. Cl.
CPC .... *H01L 31/0201* (2013.01); *H01L 31/02167* (2013.01); *H01L 31/022425* (2013.01);
(Continued)

(58) Field of Classification Search
CPC .................... H01L 31/0201; H01L 31/022441
See application file for complete search history.

(56) References Cited

U.S. PATENT DOCUMENTS

2005/0115602 A1 * 6/2005 Senta .............. H01L 31/035281
136/250
2006/0130891 A1   6/2006 Carlson
(Continued)

FOREIGN PATENT DOCUMENTS

CN    101395722 A   3/2009
EP    2009701 A1   12/2008
(Continued)

OTHER PUBLICATIONS

Sep. 1, 2015 International Search Report issued in International Patent Application No. PCT/JP2015/003326.
(Continued)

*Primary Examiner* — Eli S Mekhlin
(74) *Attorney, Agent, or Firm* — Oliff PLC

(57)   ABSTRACT

Solar cell including: a semiconductor substrate of a first conductivity type having a region of the first conductivity type and region of a second conductivity type on the back side; a first finger electrode composed of a first contact portion and first current collector, a second finger electrode composed of a second contact portion and second current collector, a first bus bar electrode, a second bus bar electrode on the backside; an insulator film disposed at least in the area just under the first bus bar electrode and second bus bar electrode; wherein the electrical contact between the first current collector and first bus bar electrode as well as
(Continued)

electrical contact between the second current collector and the second bus bar electrode are made on the insulator film; and first contact portion and the second contact portion are in a continuous line shape at least just under the insulator film.

19 Claims, 10 Drawing Sheets

(51) Int. Cl.
 H01L 31/068 (2012.01)
 H01L 31/0216 (2014.01)
 H01L 31/0224 (2006.01)
(52) U.S. Cl.
 CPC ............ *H01L 31/022433* (2013.01); *H01L 31/022441* (2013.01); *H01L 31/068* (2013.01); *H01L 31/0682* (2013.01); *Y02E 10/547* (2013.01)

(56) References Cited

U.S. PATENT DOCUMENTS

| | | |
|---|---|---|
| 2008/0223437 A1 | 9/2008 | De Ceuster |
| 2009/0126788 A1 | 5/2009 | Hishida et al. |
| 2010/0116310 A1 | 5/2010 | Shimizu et al. |
| 2010/0243028 A1 | 9/2010 | Sainoo et al. |
| 2010/0261321 A1* | 10/2010 | Hirano ............... H01L 51/0097 438/158 |
| 2011/0041908 A1 | 2/2011 | Harder |
| 2011/0120530 A1 | 5/2011 | Isaka |
| 2013/0112233 A1* | 5/2013 | Coakley ................ H05K 1/02 136/244 |
| 2013/0160825 A1 | 6/2013 | Lantzer et al. |
| 2014/0069498 A1 | 3/2014 | Cho et al. |
| 2014/0352753 A1* | 12/2014 | Degroot ............. H01L 31/0504 136/244 |
| 2015/0090317 A1 | 4/2015 | Tokuoka et al. |
| 2015/0114454 A1* | 4/2015 | Kim .................... H01L 31/0508 136/251 |
| 2015/0243818 A1 | 8/2015 | Kim et al. |

FOREIGN PATENT DOCUMENTS

| | | |
|---|---|---|
| JP | 2008-519438 A | 6/2008 |
| JP | 2009-206366 A | 9/2009 |
| JP | 2011-003724 A | 1/2011 |
| JP | 2011-507245 A | 3/2011 |
| JP | 2011-134999 A | 7/2011 |
| JP | 2012-109626 A | 6/2012 |
| JP | 5093821 B2 | 12/2012 |
| JP | 5214755 B2 | 6/2013 |
| JP | 5317209 | 10/2013 |
| JP | 2014-075532 A | 4/2014 |
| TW | 200834947 A | 8/2008 |
| TW | 201121072 A | 6/2011 |
| TW | 201248893 A | 12/2012 |
| WO | 2014002249 A1 | 1/2014 |

OTHER PUBLICATIONS

Jun. 16, 2015 International Search Report issued in International Patent Application No. PCT/JP2015/001954.
Sep. 14, 2017 Office Action issued in U.S. Appl. No. 15/315,520.
Oct. 13, 2017 Office Action issued in U.S. Appl. No. 15/315,520.
Aug. 3, 2017 Office Action issued in Chinese Application No. 201580030808.7.
Dec. 15, 2017 Extended European Search Report issued in European Patent Application No. 15807525.9.
Feb. 15, 2018 Office Action issued in U.S. Appl. No. 15/315,520.
Aug. 7, 2018 Office Action issued in U.S. Appl. No. 15/315,520.
Jul. 4, 2018 Office Action issued in Chinese Application No. 201580030808.7.
Aug. 10, 2018 Office Action issued in Taiwanese Application No. 104118945.

\* cited by examiner (1)  128

(2)  129

(3)  125

(4)  130

SOLAR CELL AND METHOD FOR PRODUCING THEREOF

TECHNICAL FIELD

The present invention relates to a solar cell and a method for producing thereof.

BACKGROUND ART

A previous back surface electrode-type solar cell is schematically shown in FIG. 14 as a cross sectional view. The back surface electrode-type solar cell 210 produced by a previous art will be described by referring to FIG. 14. On the light-receiving surface side of an N-type silicon substrate 213, a rugged shape 214 and an FSF (Front Surface Field) layer 215, which is an N-type diffusion layer, are formed. On the rugged shape 214, a dielectric passivation layer (a surface passivation layer) 217 which contains silicon dioxide and an antireflective film 216 which contains silicon nitride are formed from the side of the N-type diffusion layer 213.

On the backside of the N-type silicon substrate 213, N-type doped N-type diffusion layers 220 and P-type doped P-type diffusion layers 221 are alternately formed. In addition, on the backside of the N-type silicon substrate 213, an oxide layer (the first backside passivation film) 219 is formed. On the N-type diffusion layer 220, an N-type contact electrode 211 is formed; and on the P-type diffusion layer 221, a P-type contact electrode 212 is formed. These contact electrodes, which are joined directly to the substrate itself, can also function as finger electrodes for collecting current.

FIG. 15 is a top view schematically showing the appearance of the backside of the previous back surface electrode-type solar cell. As shown in FIG. 15, the back surface electrode-type solar cell is provided with a pair of bus bar electrodes (an N-type bus bar electrode 222, a P-type bus bar electrode 223) at the edge of the substrate for collecting current from finger electrodes (the N-type contact electrode 211, the P-type contact electrode 212). Although the electrodes nearest to the periphery of the substrate are depicted as N-type contact electrodes in FIG. 15, they may be P-type contact electrodes or metal electrodes of different type with each being P-type and N-type.

To improve the efficiency of the back surface electrode-type solar cell, full enlargement of the P-type diffusion layer, which is a power generation layer, can be expected to increase short circuit current. Accordingly, it is desirable to form the region of the P-type diffusion layer widely such as the area proportion of the P-type diffusion layer and the N-type diffusion layer in a range of 80:20 to 90:10. When the area of contact between the substrate and the contact electrodes (hereinafter, also referred to as contact area) is decreased as possible, and the passivation regions are enlarged, increase of open circuit voltage can be expected. Accordingly, it is desirable to design the contact region as small as possible by making the contact electrodes in thin line shapes or dot shapes.

Patent Literature 1 discloses a back surface electrode-type solar cell in which the contact area of the electrodes and the substrate is suppressed to the lowest possible, and the passivation regions are enlarged by three steps of forming contact electrodes, covering the portion other than the contact electrodes with an insulator film, and forming a wiring electrode.

FIG. 17 is a top view schematically showing the appearance of the backside of the previous back surface electrode-type solar cell disclosed in Patent Literature 1. In the solar cell of Patent Literature 1, however, only one pair of bus bar electrodes (an N-type bus bar electrode 222, a P-type bus bar electrode 223) are formed at the periphery of the substrate (see FIG. 17). In this arrangement, the finger electrodes are long, and accordingly the wiring resistance becomes extremely large, which causes lowering of a fill factor. This wiring resistance becomes larger in proportion to the length of wiring. It is considered that this can be solved by designing the wiring electrodes (finger electrodes) to have enlarged cross-section or the finger to have shortened length.

CITATION LIST

Patent Literature

Patent Literature 1: Japanese Patent No. 5317209

SUMMARY OF INVENTION

Technical Problem

As described above, it has been demanded for a solar cell which can have an enlarged cross-section of the finger electrodes and a shortened length of the finger electrodes while having a reduced contact area. Accordingly, it has been investigated for making the electrodes structure of a back surface electrode-type solar cell be three-dimensional structure, etc. The previous three-dimensional structure formed in the electrodes structure, however, tends to decrease the parallel resistance.

The present invention was accomplished in view of the above-described problems. It is an object of the present invention to provide a solar cell with a wide passivation region, low wiring resistance, high parallel resistance, and high conversion efficiency; and to provide a method for producing a solar cell which can produce such a solar cell at low cost.

Solution to Problem

To solve the problems described above, the present invention provides a solar cell comprising:

a semiconductor substrate of a first conductivity type wherein one of the main surfaces is a light-receiving surface, the other main surface is a backside, and the backside of the semiconductor substrate has a region of the first conductivity type and a region of a second conductivity type, being an opposite conductivity type to the first conductivity type;

a first finger electrode composed of a first contact portion joined to the region of the first conductivity type and a first current collector formed on the first contact portion;

a second finger electrode composed of a second contact portion joined to the region of the second conductivity type and a second current collector formed on the second contact portion;

a first bus bar electrode being in electrical contact with the first current collector;

a second bus bar electrode being in electrical contact with the second current collector; and an insulator film disposed at least in the whole area just under the first bus bar electrode and the second bus bar electrode;

wherein the electrical contact between the first current collector and the first bus bar electrode as well as the electrical contact between the second current collector and the second bus bar electrode are made on the insulator film; and the first contact portion and the second contact portion are each in a continuous line shape at least just under the insulator film.

In such a solar cell, it is possible to increase the number of the bus bar electrodes, to shorten the length of the finger electrodes, and to collect current from finger electrodes on both sides of the bus bar electrodes by installing an insulator film and forming three-dimensional structure of bus bar electrodes and finger electrodes. As a result, it is possible to decrease the wiring resistance and to increase the fill factor. In addition to the insulator film, by which the bus bar electrodes and the finger electrodes for different conductivity type will not be in contact with each other, the bus bar electrodes are not in contact with the substrate directly, which makes the solar cell be hard to shunt. The region having the bus bar electrodes formed is flat, and is hard to generate bleeding thereby in forming the bus bar electrodes. As a result, the solar cell can have a high parallel resistance. Furthermore, the contact portions are each in a continuous line shape just under the insulator film, and accordingly it is possible to form three-dimensional structure of bus bar electrodes and finger electrodes without increasing the number of steps in the production.

It is to be noted that the shunt referred herein means decrease of the parallel resistance. This is probably caused by a connection between the P-type finger electrode and the N-type finger electrode (i.e., short-circuit) through the bus bar electrode or the diffusion layer having the same conductivity type (the N-type diffusion layer or the P-type diffusion layer). The term "to shunt" means to form such a state.

As described above, even when reducing the contact portion in order to enlarge the passivation regions as possible, the presence of the current collector makes it possible to enlarge the cross-section of the finger electrodes and to decrease the wiring resistance. Such a solar cell can be a low cost solar cell with low wiring resistance and high conversion efficiency.

Incidentally, the bus bar electrode refers to an electrode for collecting current which is in electrical connection with a current collector of a finger electrode. The bus bar electrode is generally formed at a position almost intersecting with the finger electrode at right angles.

It is preferable that the first bus bar electrode and the second bus bar electrode be each in a continuous line shape, and the insulator film be in a continuous line shape.

Such a solar cell can make a module with higher reliability.

It is also preferable that the total number of the first bus bar electrode and the second bus bar electrode be 4 or more and 10 or less.

Such a solar cell can further decrease the wiring resistance of the finger electrode without increasing the thickness of the finger electrode. For example, compared to a case when the total number of the bus bar electrodes is 2, the wiring resistance can be decreased to one-sixth when the total number is 6, and to one-tenth when the total number is 10.

It is also preferable that the insulator film be composed of a material which contains one or more resins selected from the group consisting of silicone resins, polyimide resins, polyamide-imide resins, fluororesins, phenolic resins, melamine resins, urea resins, polyurethanes, epoxy resins, acrylic resins, polyester resins, and poval resins.

Insulator films composed of such material has excellent heat resistivity. Accordingly, these insulator films are preferable when heat treatment is performed in forming an electrode.

It is also preferable that the insulator film have a thickness of 1 to 60 μm.

In such a solar cell, the insulation property can be more improved. It is also possible to produce a desired solar cell at lower cost since it does not form the insulator film excessively.

It is also preferable that the first current collector, the second current collector, the first bus bar electrode, and the second bus bar electrode be each composed of a material which contains one or more kinds of conductive materials selected from the group consisting of Ag, Cu, Au, Al, Zn, In, Sn, Bi, and Pb, and one or more kinds of resins selected from the group consisting of epoxy resins, acrylic resins, polyester resins, phenolic resins, and silicone resins.

When the solar cell is composed of such an electrode material, this electrode material does not directly joined to a semiconductor substrate such as a silicon substrate in heating for forming an electrode, and an increase of the contact area can be suppressed accordingly.

The present invention also provide a method for producing a solar cell including a semiconductor substrate of a first conductivity type wherein one of the main surfaces of the semiconductor substrate is a light-receiving surface, the other main surface is a backside, and the backside of the semiconductor substrate has a region of the first conductivity type and a region of a second conductivity type, being an opposite conductivity type to the first conductivity type; comprising the steps of:

forming the region of the first conductivity type and the region of the second conductivity type on the backside;

forming a first contact portion joined to the region of the first conductivity type and a second contact portion joined to the region of the second conductivity type such that each of them has a continuous line shape at least in a part thereof;

forming an insulator film so as to cover the upper portion and the side portion of the part having a continuous line shape in the first contact portion and the second contact portion;

forming a first bus bar electrode and a second bus bar electrode only on the insulator film;

forming a first current collector being in electrical contact with the first bus bar electrode on the first contact portion; and forming a second current collector being in electrical contact with the second bus bar electrode on the second contact portion.

Such a method for producing a solar cell can produce a back surface electrode-type solar cell with a wide passivation region, low wiring resistance, high parallel resistance, and high conversion efficiency at low cost and with high productivity.

It is to be noted that the contact portion is defined as an electrode that is in contact with the semiconductor substrate, particularly the region of the first conductivity type and the region of the second conductivity type in this description. The current collector is defined as an electrode that connects the bus bar electrode and the contact portion. The current collector and the contact portion are generically referred to as a finger electrode. The current collector can be also referred to as a "line portion".

It is preferable that the step for forming a first bus bar electrode and a second bus bar electrode and the step for forming a first current collector and a second current collector be performed simultaneously.

This can further reduce the number of steps and can produce a solar cell with higher conversion efficiency at lower cost.

Advantageous Effects of Invention

In the inventive solar cell, it is possible to increase the number of the bus bar electrodes, to shorten the length of the finger electrodes, and to collect current from finger electrodes on both sides of the bus bar electrodes by installing insulator films and forming three-dimensional structure of bus bar electrodes and finger electrodes. As a result, it is possible to decrease the wiring resistance and to increase the fill factor. Moreover, it is possible to increase the cross-section of the finger electrode to decrease the wiring resistance while decreasing the contact area by forming the current collectors on the contact portion, and to improve the open-circuit voltage thereby. Furthermore, since the bus bar electrodes are not in contact with the substrate directly, the solar cell will not shunt. Moreover, it is possible to suppress bleeding in forming the bus bar electrodes by flattening the area to form the bus bar electrode, and to improve the yield thereby. Furthermore, the inventive method for producing a solar cell can produce such a solar cell without increasing production steps.

DESCRIPTION OF EMBODIMENTS

As described above, it has been demanded to provide a solar cell with a wide passivation region, low wiring resistance, high parallel resistance, and high conversion efficiency. It has also been demanded to provide a method for producing a solar cell which can produce a solar cell with a wide passivation region, low wiring resistance, high parallel resistance, and high conversion efficiency at low cost.

Figure 9:
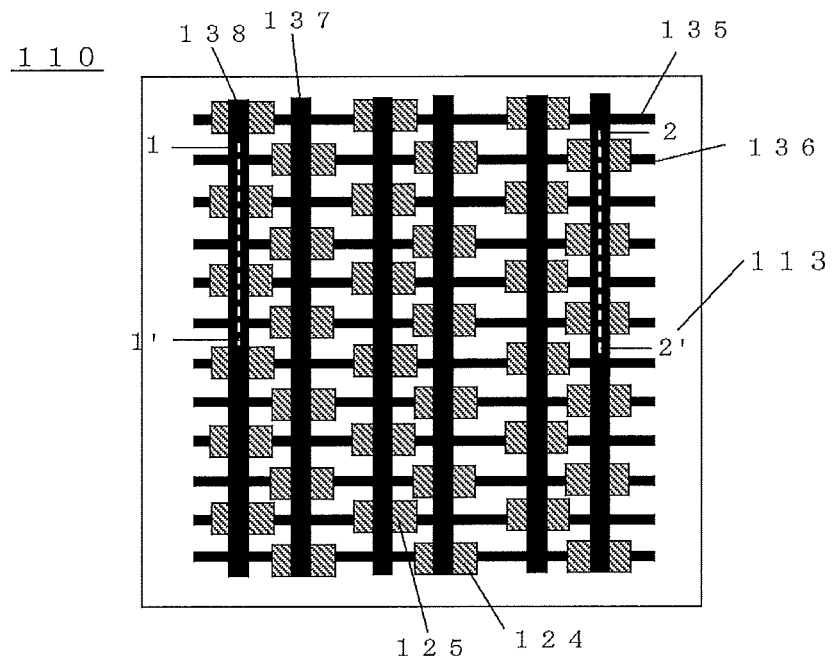
FIG. 9 is a top schematic view showing an example of the solar cell investigated by the present inventors.
Figure 10:
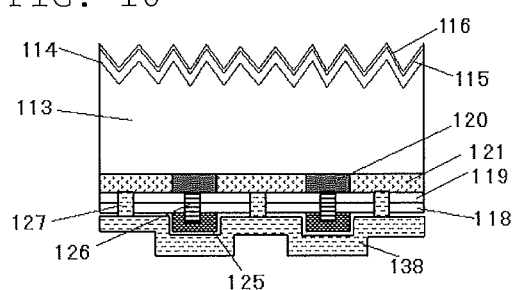
FIG. 10 is a cross sectional schematic view showing an enlarged part of the solar cell investigated by the present inventors.
Figure 11:
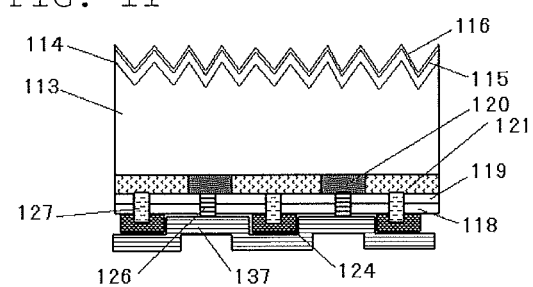
FIG. 11 is a cross sectional schematic view showing an enlarged part of the solar cell investigated by the present inventors.

The inventors have investigated to obtain a solar cell that satisfies such demands. First, they investigated a solar cell provided with bus bar electrodes disposed inner than in the previous one, an insulator film(s) disposed so as not to connect the finger electrodes and the bus bar electrodes for different conductivity type, and finger electrodes composed of contact portions and current collectors forming three-dimensional structure with the bus bar electrodes. An example of such a solar cell is shown in FIGS. 9 to 11. FIG. 9 is a top schematic view showing an example of the solar cell investigated by the present inventors. FIGS. 10 and 11 are cross sectional schematic views each showing an enlarged part of the solar cell investigated by the present inventors. Incidentally, FIG. 10 is a cross sectional schematic view taken along the line 1-1' of the solar cell shown in FIG. 9. FIG. 11 is a cross sectional schematic view taken along the line 2-2' of the solar cell shown in FIG. 9.

In the solar cell 110 shown in FIG. 9, the wiring resistance is decreased by providing plural first bus bar electrodes 137 and second bus bar electrodes 138, together with shortening the length of the finger electrodes as possible. In this solar cell, the insulator films 124 and 125 are provided only in regions where the finger electrodes and the bus bar electrodes for different conductivity type intersect with each other (hereinafter, referred to as an insulation region) in order to provide plural bus bar electrodes. This makes the three-dimensional structure to be easily formed. In this solar cell, the shapes of the first contact portion 126 and the second contact portion 127 can be dot shapes, etc. except just under the insulator films, and can decrease the contact area thereby.

Figure 14:
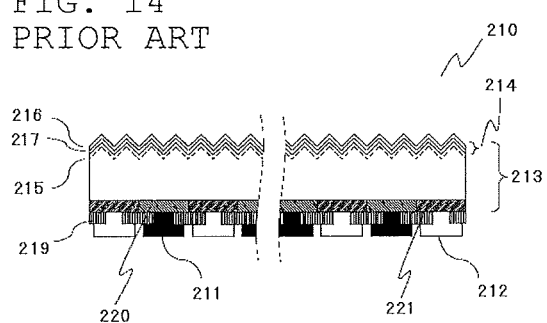
FIG. 14 is a cross sectional view schematically showing a previous back surface electrode-type solar cell.
Figure 15:
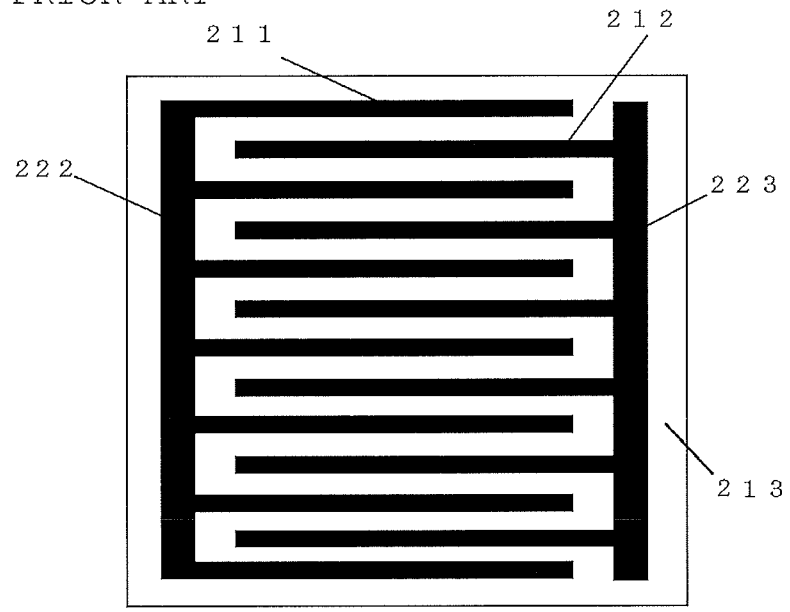
FIG. 15 is a top view schematically showing the appearance of the backside of a previous back surface electrode-type solar cell.

As shown in FIGS. 10 and 11, the first contact portion 126 is joined to the region 120 of the first conductivity type formed on the backside of the semiconductor substrate 113 having the first conductivity type, and the first current collector 135 is formed thereon as shown in FIG. 9. On the other hand, the second contact portion 127 is joined to the region 121 of the second conductivity type, and the second current collector 136 is formed thereon as shown in FIG. 9. The first current collector 135 is in electrical contact with the first bus bar electrode 137, and the second current collector 136 is in electrical contact with the second bus bar electrode 138. The other structures are basically the same as in the solar cell shown in FIG. 14. On the light-receiving surface side, the rugged shape 114, the FSF layer 115, and the antireflective film 116 are disposed; and on the backside, the first backside passivation film 119 and the second backside passivation film 118 are disposed.

Hereinafter, the method for producing a solar cell in which the bus bar electrodes and the finger electrodes form three-dimensional structure will be described with reference to FIGS. 12 and 16. Each of FIGS. 12 and 16 is a top view showing the steps of forming electrodes of the solar cell investigated by the present inventors.

Figure 16:
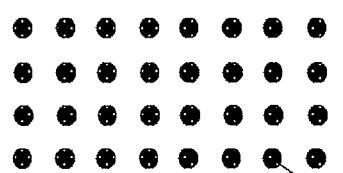
FIG. 16 is a top view showing the steps of forming electrodes of the solar cell investigated by the present inventors.
Figure 16:
Figure 16:
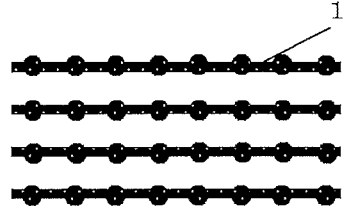
Figure 16:
Figure 16:
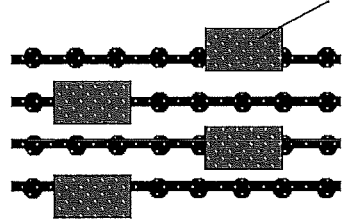
Figure 16:
Figure 16:
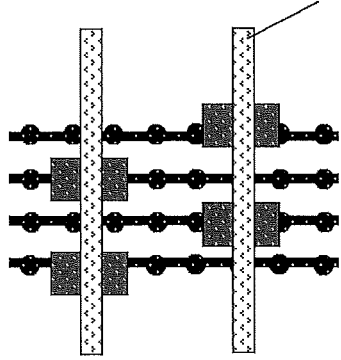
Figure 17:
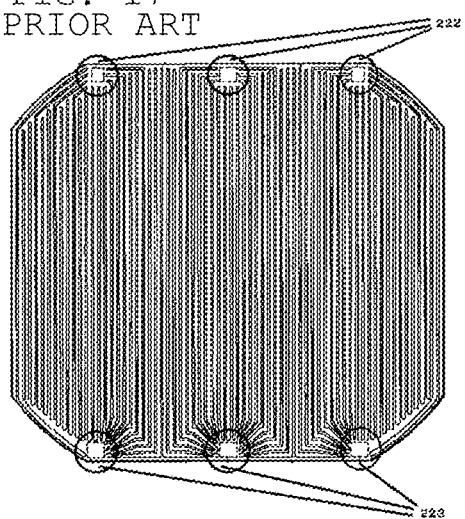
FIG. 17 is a top view schematically showing the appearance of the backside of a previous back surface electrode-type solar cell disclosed in Patent Literature 1.

In the method shown in FIG. 16, contact electrodes 128 are formed discontinuously each in a dot shape (FIG. 16 (1)), other wiring electrodes 129 are then formed to connect these electrodes (FIG. 16 (2)), insulator films 125' are disposed only in the insulation regions (FIG. 16 (3)), and bus bar electrodes 130 are formed (FIG. 16 (4)). This case needs the step of forming the wiring electrodes 129 as described above, which increases the steps to increase the cost.

Figure 12:
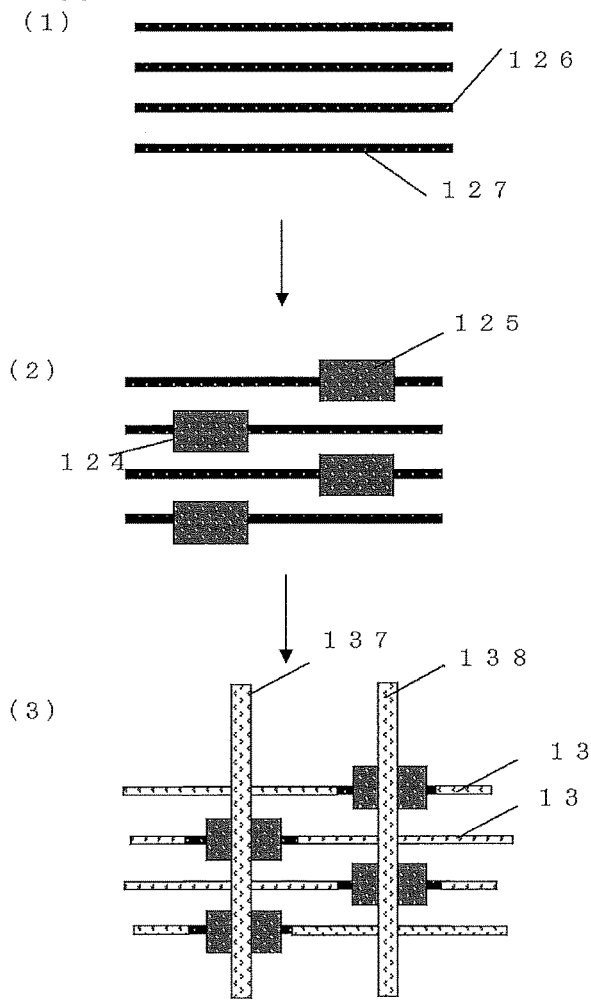
FIG. 12 is a top view showing the steps of forming electrodes of the solar cell investigated by the present inventors.

In the method shown in FIG. 12, first contact portions 126 and second contact portions 127 are formed (FIG. 12 (1)), insulator films 124 and 125 are formed only in the insulation regions (FIG. 12 (2)), and thereafter, second current collectors 136 and first current collectors 135 can be formed simultaneously with forming first bus bar electrodes 137 and second bus bar electrodes 138 (FIG. 12 (3)). This can increase the cross-section of the finger electrode without increasing the number of steps compared to the method shown in FIG. 16, and can decrease the wiring resistance thereby.

Figure 13:
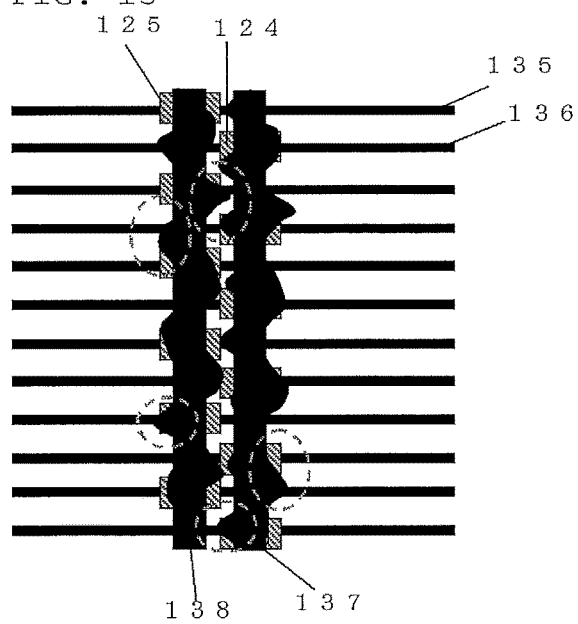
FIG. 13 is a top schematic view of a backside showing an example of a fault generated in the solar cell investigated by the present inventors.

In the solar cell shown in FIG. 9, the insulator films 124 and 125 are partially formed only in the insulation regions. As a result, portions having the insulator films formed thereon and portions without the insulator film are contained in the spot where bus bar electrodes will be formed. In this case, the bus bar electrodes have large area to be in contact with the substrate directly, and are liable to shunt. Moreover, the insulator film generally has a thickness of 1 to 60 µm. Accordingly, when the bus bar electrode is tried to be formed on the insulator film, the discharge amount becomes unequal to generate bleeding as shown in broken lined parts in FIG. 13. Herein, FIG. 13 is a top schematic view of a backside showing an example of a fault generated in the solar cell investigated by the present inventors. This causes a P-type finger electrode to be in contact with an N-type bus bar electrode, for example, to decrease the parallel resistance of the solar cell, and to largely decrease the conversion efficiency thereby.

The present inventors have further investigated to solve the foregoing subject. As a result, it was found that the foregoing subject can be solved by a solar cell provided with an insulator film(s) in the whole area just under the bus bar electrodes in which the bus bar electrodes and the finger electrodes form three-dimensional structure; thereby completing the inventive solar cell. It was also found that the foregoing subject can be solved by a method for producing a solar cell in which the bus bar electrodes are formed only on the insulator film(s) and the bus bar electrodes and the finger electrodes form three-dimensional structure; thereby completing the inventive method for producing a solar cell.

Hereinafter, the inventive solar cell will be specifically described with referring to figures, but the present invention is not limited thereto. It is to be noted that the following explanation mainly describes a case in which the semiconductor substrate of a first conductivity type is an N-type silicon substrate (i.e., the first conductivity type is an N-type, and the second conductivity type is a P-type). However, even when the semiconductor substrate of the first conductivity type is a P-type silicon substrate, the present invention can be applied similarly by using an impurity source such as boron, phosphorous, etc. inversely.

[Solar Cell (Back Surface Electrode-Type Solar Cell)]

Figure 1:
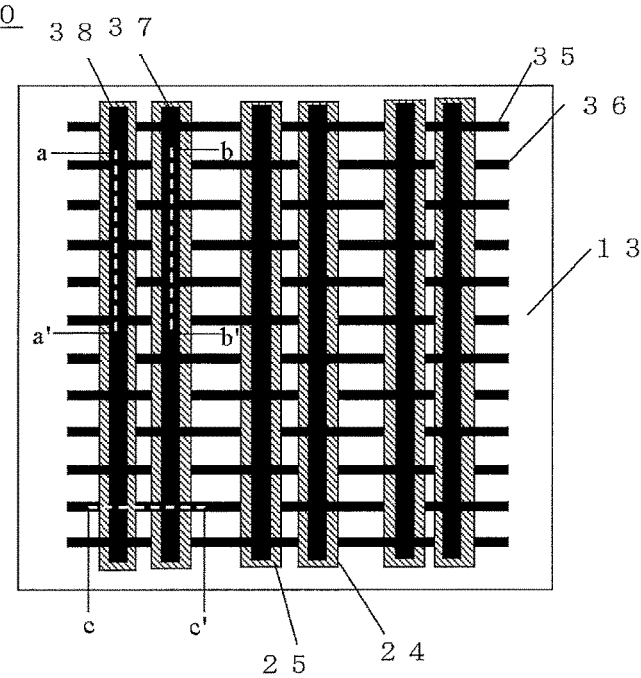
FIG. 1 is a top schematic view showing an example of the inventive solar cell.
Figure 2:
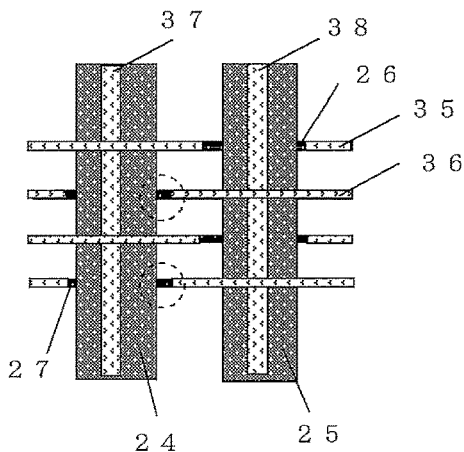
FIG. 2 is a magnified view showing an enlarged part of the inventive solar cell.
Figure 3:
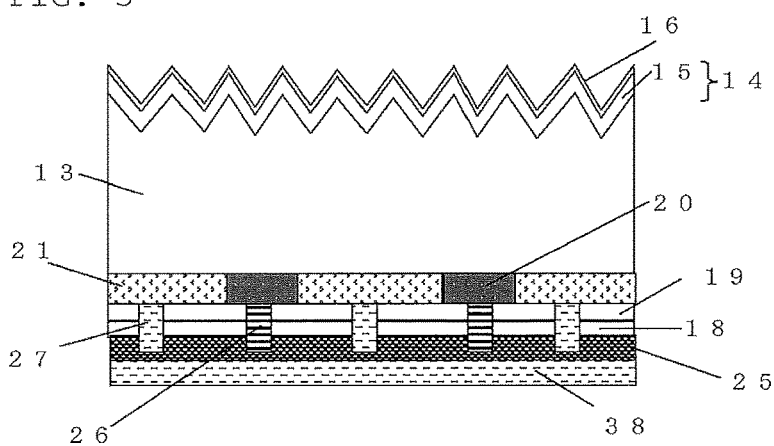
FIG. 3 is a cross sectional schematic view showing an enlarged part of the inventive solar cell.
Figure 4:
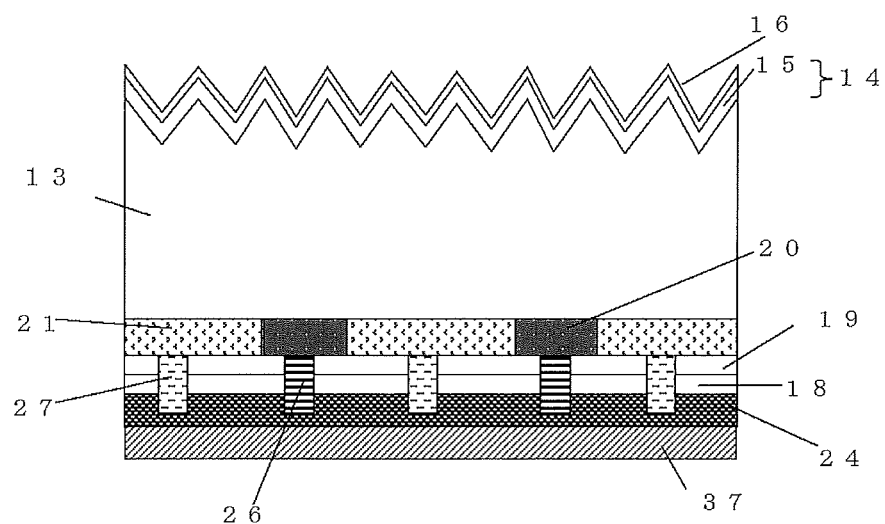
FIG. 4 is a cross sectional schematic view showing an enlarged part of the inventive solar cell.
Figure 5:
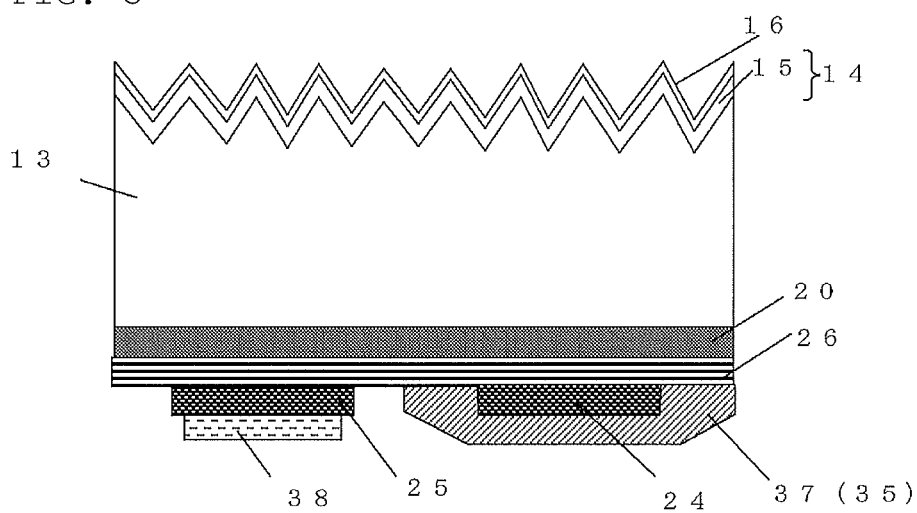
FIG. 5 is a cross sectional schematic view showing an enlarged part of the inventive solar cell.

FIG. 1 is a top schematic view showing an example of the inventive solar cell. FIG. 2 is a magnified view showing an enlarged part of the inventive solar cell. FIGS. 3 to 5 are cross sectional schematic views each showing an enlarged part of the inventive solar cell. Incidentally, FIG. 3 is a cross sectional view taken along the line a-a' of the solar cell shown in FIG. 1; FIG. 4 is a cross sectional view taken along the line b-b' of the solar cell shown in FIG. 1; and FIG. 5 is a cross sectional view taken along the line c-c' of the solar cell shown in FIG. 1.

As shown in FIG. 1, the inventive solar cell 10 is provided with the semiconductor substrate 13 of a first conductivity type wherein one of the main surfaces is a light-receiving surface, the other main surface is a backside. As shown in FIGS. 3 to 5, the solar cell 10 is a solar cell in which the backside of this semiconductor substrate has the region 20 of the first conductivity type (N-type diffusion layer) and a region 21 of a second conductivity type (P-type diffusion layer), having an opposite conductivity type to the first conductivity type, so-called a back surface electrode-type solar cell.

As shown in FIGS. 2 to 5, the solar cell 10 is further provided with a first finger electrode(s) composed of the first contact portion 26 joined to the region 20 of the first conductivity type and the first current collector 35 formed on the first contact portion 26. It is also provided with a second finger electrode(s) composed of the second contact portion 27 joined to the region 21 of the second conductivity type and the second current collector 36 formed on the second contact portion 27. Moreover, it also provided with the first bus bar electrode 37 being in electrical contact with the first current collector 35; and the second bus bar electrode 38 being in electrical contact with the second current collector 36.

As described above, the first current collector 35 and the second current collector 36 are joined to the first contact portion 26 and the second contact portion 27 respectively, which can collect current from the contact portions to the bus bar electrodes.

In this solar cell 10, as shown in FIGS. 3 to 5, it is possible to form a rugged shape 14 and an FSF layer (N-type diffusion layer) 15 on the light-receiving surface side of the semiconductor substrate 13 of a first conductivity type. Over the rugged shape 14, it is possible to form an antireflective film 16 which contains silicon nitride, etc. A dielectric passivation layer (not shown in the figures) can be formed between the FSF layer 15 and the antireflective film 16.

On the backside of the semiconductor substrate 13 of a first conductivity type, an oxide layer (a first backside passivation film) 19 can be formed. It is also possible to form a second backside passivation film 18 on the oxide layer 19. It is preferable that each of the light-receiving surface and the backside be covered with a protective layer (a passivation film). The passivation film is preferably composed of one or more materials selected from a silicon oxide film, a silicon nitride film, and an aluminum oxide film.

As shown in FIG. 2, the solar cell 10 is provided with insulator films 24 and 25 at least in the whole area just under the first bus bar electrode 37 and the second bus bar electrode 38. On the insulator film 24, the first current collector 35 and the first bus bar electrode 37 are in electrical contact with each other. On the insulator film 25, the second current collector 36 and the second bus bar electrode 38 are in electrical contact with each other.

Each of the insulator films 24 and 25 is generally formed in a thickness that can cover the upper portion and the side portion of the first contact portion 26 and the second contact portion 27 on the contact portions just under the first bus bar electrode 37 and the second bus bar electrode 38.

In the solar cell 10, as shown in FIGS. 2 to 5, the first contact portion 26 and the second contact portion 27 are each in a continuous line shape at least just under the insulator films 24 and 25. As shown in FIG. 5, the bus bar electrode and the finger electrode for different conductivity type can be physically joined via the insulator films 24 and 25 in the solar cell 10. That is, a bus bar electrode and a current collector for different conductivity type are not electrically joined (are separated). On the other hand, in a region where the bus bar electrode and the finger electrode for the same conductivity type intersect with each other (nearest portion), the insulator films 24 and 25 are sandwiched between the contact portion and the current collector as shown in FIG. 5. That is, a bus bar electrode and a current collector for the same conductivity type are electrically joined on an insulator film. Incidentally, 37 (35) in FIG. 5 indicates a portion where the first bus bar electrode 37 and the first current collector 35 are superimposed (electrically joined).

In such a solar cell, it is possible to form three-dimensional structure of the bus bar electrode(s) and the finger electrode(s) by installing the insulator film(s). This makes it possible to increase the number of bus bar electrodes and to shorten the length of the finger electrodes. Since the bus bar electrode will not be in contact with the silicon substrate, the solar cell does not generate shunt. By forming the insulator film(s) in the whole area just under the bus bar electrodes, it is possible to insulate the first finger electrode(s) from the second bus bar electrode(s) more securely, and to insulate the second finger electrode(s) from the first bus bar electrode(s) more securely without generating process failure in forming the bus bar electrodes. This can provide a solar cell with high parallel resistance and high conversion efficiency. In the inventive solar cell, the contact portion directly joined to the substrate itself is formed in a continuous line shape just under the insulator film. Accordingly, it is possible to reduce a step for connecting the contact portions with each other as shown in FIG. 16 (2), and to produce a low cost solar cell in high yield.

Hereinafter, each component of the inventive solar cell will be described more specifically.

[Semiconductor Substrate of First Conductivity Type]

The semiconductor substrate that can be used in the present invention is not particularly limited. For example, an N-type silicon substrate can be used. In this case, the thickness of the substrate can be a thickness of 100 to 200 µm, for example. The shape and the area of the main surface of the substrate are not particularly limited.

[Contact Portion]

As a material for the first contact portion and the second contact portion, it is possible to use a fluidal paste in which silver powder and glass frit are mixed with an organic binder (hereinafter, referred to as a sintered paste), for example.

As described above, the contact portion directly joined to the substrate itself has to be formed in a continuous line shape just under the insulator film, but in the other part, the shape of the contact portion is not particularly limited. For example, it is preferable that the contact portion have a dot shape, a line shape, or a combination thereof in a part where the insulator film is not formed. For example, if the shape of the contact portion at the part is in a dot shape, the contact area can be made smaller. This makes it possible to enlarge the passivation region, and to increase the open-circuit voltage thereby.

It is also preferable that the width and the length of the insulator film formed just under the bus bar electrode be larger than those of the bus bar electrode. This design makes it possible to separate the first bus bar electrode and the second contact portion sufficiently, and to separate the second bus bar electrode and the first contact portion sufficiently. Such a design also allows the insulator film to cover the flank of the contact portion sufficiently. Accordingly, it is possible to securely achieve the insulation between electrodes for different conductivity type.

[Insulator Film]

Figure 8:
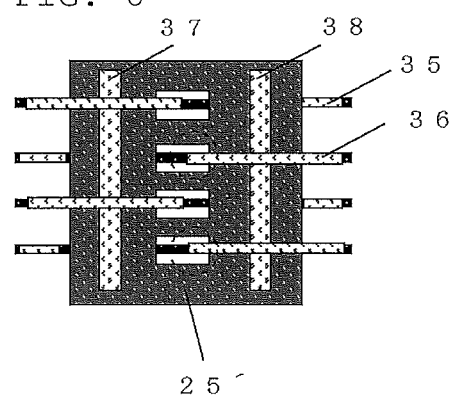
FIG. 8 is a top schematic view showing an example of the inventive solar cell.

The insulator film is formed at least in the whole area just under the bus bar electrodes. The number and the shape of the insulator film are not particularly limited. As shown in FIG. 1, the insulator film is preferably in a continuous line shape. As another example of the shape of the insulator film, the shape shown in FIG. 8 can be cited. Herein, FIG. 8 is a top schematic view showing an example of the inventive solar cell. FIG. 8 shows an embodiment in which the insulator film 25' is formed largely, and the insulator film 24 (the insulator film just under the first bus bar electrode 37) and the insulator film 25 (the insulator film just under the second bus bar electrode 38) in FIG. 1 are integrated and formed. With the proviso that a part of the insulator film 25' is opened as shown in FIG. 8 in order to make the electrode structure be three-dimensional structure and to bring the bus bar electrode and the finger electrode for the same conductivity type to be in contact with each other. When the insulator film is in a shape shown in FIG. 8, the contact portion(s) and the other portion(s) have the equal height, and accordingly, displacement can be avoided in the next step of forming a current collector(s) by printing. The insulator film shown in FIG. 1 and FIG. 8 prevents the bus bar electrode from being in contact with the substrate directly, and decreases the ruggedness in a region where the bus bar electrode is formed to prevent shunt due to generation of bleeding in forming the bus bar electrode.

It is to be noted that the insulator film is generally formed so as to cover the side portion and the upper portion of the contact portion just under the bus bar electrodes. The insulator film preferably has a width and a length larger than those of the bus bar electrode.

The thickness of the insulator film is preferably 1 to 60 µm, more preferably about 5 to 40 µm, and particularly preferably 10 to 30 µm. Such a thickness makes it possible to further improve the insulation property. It does not form excess insulator film, and accordingly, it is possible to produce a desirable solar cell at lower cost.

This insulator film is preferably composed of a material (hereinafter, described as an insulation material) which at least contains one or more resins selected from the group consisting of silicone resins, polyimide resins, polyamide-imide resins, fluororesins, phenolic resins, melamine resins, urea resins, polyurethanes, epoxy resins, acrylic resins, polyester resins, and poval resins. Particularly, when a heat treatment is performed in forming the current collector and the bus bar electrode, it is desirable to select a heat resistant resin. For example, siloxane bond, which is a main chain of a silicone resin, has large bond energy and is stable, thereby having superior heat resistance and weatherability compared to organic polymer materials with a main chain composed of carbon backbone. Other resins become materials with high heat resistance by introducing an aromatic ring into the molecular chain.

[Current Collector, Bus Bar Electrode]

The current collector and the bus bar electrode are preferably composed of a material which contains one or more kinds of conductive materials selected from the group consisting of Ag, Cu, Au, Al, Zn, In, Sn, Bi, and Pb, and one or more kinds of resins selected from the group consisting of epoxy resins, acrylic resins, polyester resins, phenolic resins, and silicone resins. These portions composed of such an electrode material do not have to contain glass frit, and accordingly, the electrode material is not directly joined to the semiconductor substrate such as a silicon substrate in heating, and increase of contact area can be suppressed.

The number of the bus bar electrode is not particularly limited, but it is preferable that the total number be 4 or more and 10 or less. This makes it possible to decrease the wiring resistance of the finger electrode, and to improve the conversion efficiency. Incidentally, the shape of the bus bar electrode is not particularly limited. For example, the shape of the bus bar electrode can be a discontinuous shape divided in the longitudinal direction of the bus bar electrode. As the shape of the bus bar electrode, the one in a continuous line shape is preferable. Such a shape can be produced easily.

As shown in FIG. 1, etc., the current collector and the bus bar electrode can be formed so as to intersect at a right angle.

Incidentally, the first finger electrode is generally formed in a direction along the longitudinal direction of the region of the first conductivity type. The second finger electrode is generally formed in a direction along the longitudinal direction of the region of the second conductivity type. In general, finger electrodes are formed in the plural number.

[Method for Producing Solar Cell]

Figure 6:
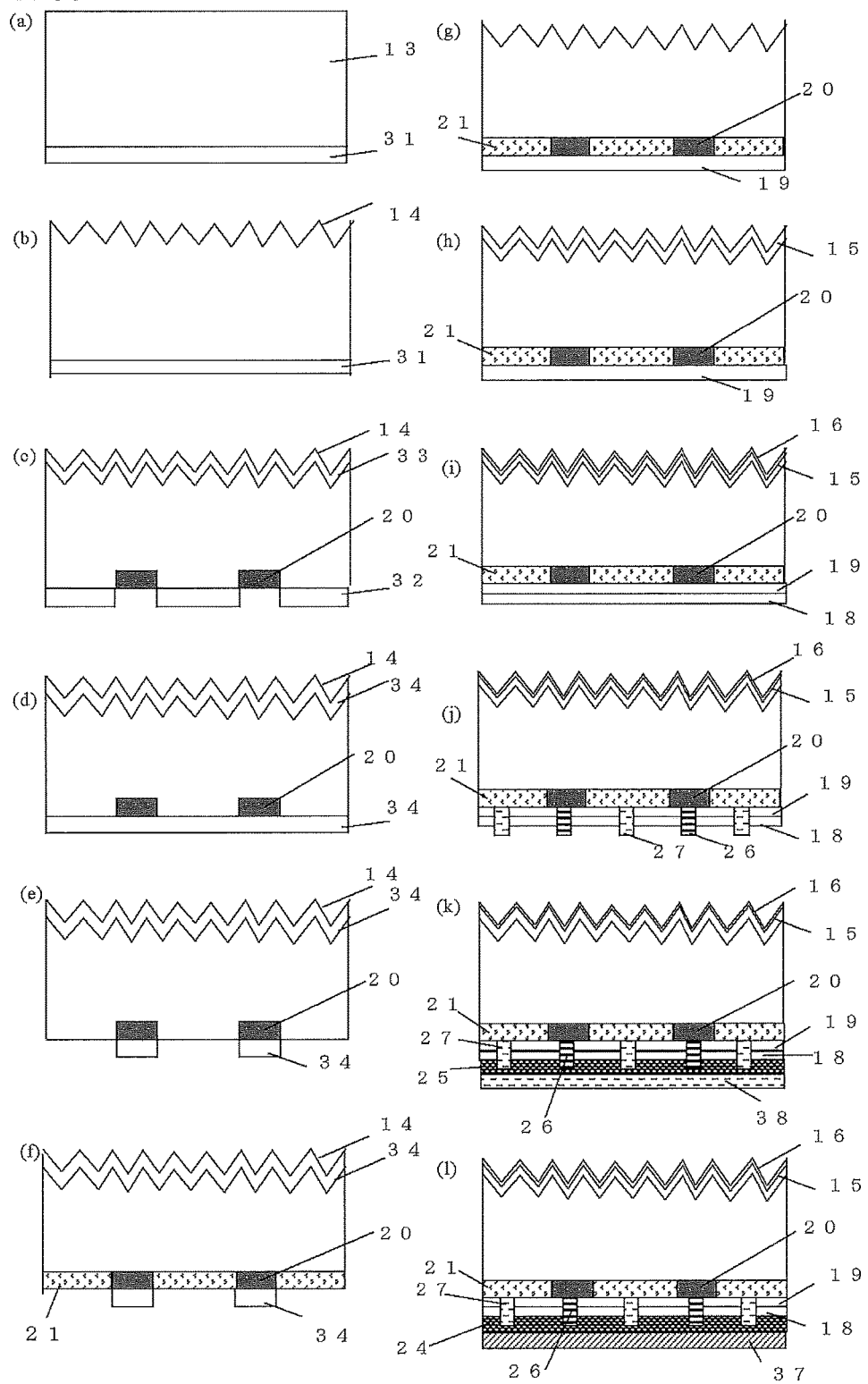
FIG. 6 is a flow diagram showing an example of the inventive method for producing a solar cell.

FIG. 6 is a flow diagram showing an example of the inventive method for producing a solar cell. Hereinafter, an example of the inventive method for producing a back surface electrode-type solar cell will be described with referring to the cross sectional schematic views shown in FIG. 6 (a) to (l). Particularly, in a case of an N-type silicon substrate is exemplified. Hereinafter, the region of the first conductivity type is also described as an N-type diffusion layer, and the region of the second conductivity type is also described as a P-type diffusion layer. The method described below is a typical example, and the present invention is not limited thereto.

First, the N-type silicon substrate 13 with a thickness of 100 to 200 µm is prepared, for example, as a semiconductor substrate of the first conductivity type in which one of the main surfaces becomes a light-receiving surface, and the other main surface becomes a backside. One of the main surfaces of this N-type silicon substrate 13 becomes a light-receiving surface, and the other main surface becomes a backside. Then, as shown in FIG. 6 (a), a texture mask 31 such as a silicon nitride film is formed on a backside (hereinafter, referred to as "a backside of an N-type silicon substrate"), which is a backside of a face to be a light-receiving surface of this N-type silicon substrate 13 (hereinafter, referred to as "a light-receiving surface of an N-type silicon substrate") by a CVD method or a sputter method etc.

Subsequently, a rugged shape 14, which is a texture structure, is formed on the light-receiving surface of the N-type silicon substrate 13 by etching as shown in FIG. 6 (b). The etching is performed, for example, by use of a solution in which isopropyl alcohol is added to an aqueous alkaline solution including sodium hydroxide or potassium hydroxide and heated to 60° C. or more and 80° C. or less.

Then, the next step will be described by use of FIG. 6 (c). After removing the texture mask 31 formed on the backside of the N-type silicon substrate 13, diffusion masks 32 and 33 such as silicon oxide films are formed on the light-receiving surface and the backside of the N-type silicon substrate 13 as shown in FIG. 6 (c). To a portion where the N-type diffusion layer will be formed, etching paste is applied by a screen printing method, etc., and this is subjected to heat treatment to remove the diffusion mask 32 at the portion where the N-type diffusion layer will be formed to expose the substrate. The etching paste after patterning treatment is subjected to ultrasonic cleaning and removed by acid treatment. This etching paste contains at least one etching component selected from the group consisting of phosphoric acid, hydrogen fluoride, ammonium fluoride, and ammonium hydrogen fluoride, and contains water, an organic solvent and a thickener, for example. This treatment can be performed by using a photolithography method.

Thereafter, to the exposed portion on the backside of the N-type silicon substrate 13, phosphorous as an N-type impurity is diffused by vapor-phase diffusion using $POCl_3$ to form an N-type diffusion layer 20. The N-type diffusion layer can be formed by spin coating of a solution in which an N-type impurity such as phosphoric acid is dissolved into alcohol or water, and performing thermal diffusion.

Subsequently, as shown in FIG. 6 (d), hydrofluoric acid treatment is performed to remove the diffusion mask 32 and the diffusion mask 33 formed on the N-type silicon substrate 13, as well as glass layers formed by diffusion of phosphorous into the diffusion masks 32 and 33, and then thermal oxidation is performed in an oxygen or a steam atmosphere to form a silicon oxide film 34.

Next, as shown in FIG. 6 (e), to a portion where a P-type diffusion layer will be formed on the backside of the N-type silicon substrate 13, etching paste is applied by a screen printing method, etc., and this is subjected to heat treatment to remove the diffusion mask 34 at the portion where the P-type diffusion layer will be formed to expose the substrate. The etching paste after patterning treatment is subjected to ultrasonic cleaning and removed by acid treatment. This etching paste contains at least one etching component selected from the group consisting of phosphoric acid, hydrogen fluoride, ammonium fluoride, and ammonium hydrogen fluoride, and contains water, an organic solvent and a thickener, for example.

As shown in FIG. 6 (f), the backside of the N-type silicon substrate 13 is spin coated with a solution in which a P-type impurity source such as boric acid is dissolved in alcohol or water, and after drying, subjected to heat treatment to diffuse boron as a P-type impurity into the exposed portion on the backside of the N-type silicon substrate 13, thereby forming a P-type diffusion layer 21. In this case, the P-type diffusion layer 21 can also be formed by a vapor-phase diffusion method using $BBr_3$, etc.

Then, the next step is described using FIG. 6 (g). As shown in FIG. 6 (g), hydrofluoric acid treatment is performed to remove the silicon oxide film 34 formed on the N-type silicon substrate 13, and a glass layer formed by diffusion of boron into the silicon oxide film 34. Subsequently, on the backside of the N-type silicon substrate 13, a first backside passivation film 19 that doubles as a diffusion mask such as a silicon oxide film is formed by a CVD method or by applying SOG (spin on glass) and baking.

Subsequently, as shown in FIG. 6 (h), on the light-receiving surface of the N-type silicon substrate 13, an n⁻ layer (an FSF layer 15), which is a light-receiving surface diffusion layer, can be formed by a method of spin coating of a solution in which N-type impurity such as phosphoric acid is dissolved in alcohol or water followed by thermal diffusion, or by a vapor-diffusion method using $POCl_3$.

On the backside of the N-type silicon substrate 13, a second backside passivation film 18 such as a nitride film is formed by CVD or a sputtering method as shown in FIG. 6 (i). The nitride film may also be formed on the front face as an antireflective film 16 by CVD or a sputtering method.

In the present invention, the method for forming the region 20 of the first conductivity type (N-type diffusion layer) and the region 21 of the second conductivity type (P-type diffusion layer) on the backside of the N-type silicon substrate is not limited to the method shown in FIG. 6 (a) to (i), and can be altered appropriately.

Then, as shown in FIG. 6 (j), electrodes are formed on the N-type diffusion layer 20 and the P-type diffusion layer 21 formed on the backside of the N-type silicon substrate 13.

Figure 7:
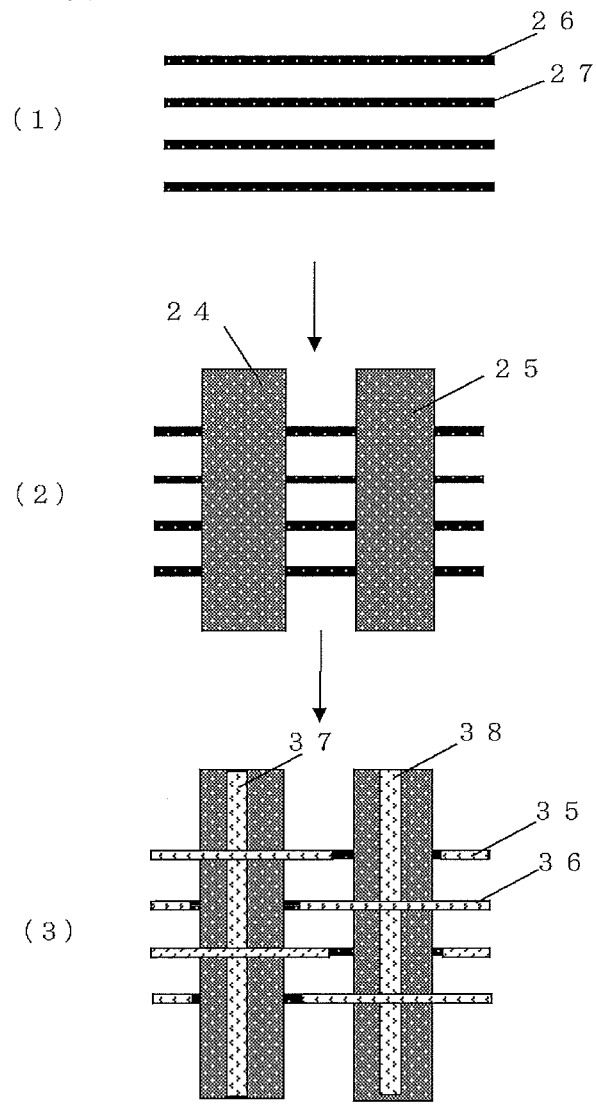
FIG. 7 is a top view showing the steps of forming electrodes of the inventive solar cell.

FIG. 7 is a top view showing the steps of forming electrodes of the inventive solar cell. As shown in FIG. 7, the first contact portion 26 and the second contact portion 27 are electrodes to form contact with the silicon substrate. Each electrode pattern of these contact portions has to be a pattern in a continuous line shape at least in a region where the contact portion and the bus bar electrode intersect. In other portions, it may be a discontinuous shape such as ellipses, rectangles, and dots, or may be a line shape. These shapes can coexist therein. By forming the contact portion in a line shape in the region where the contact portion and the bus bar electrode intersect, it is possible to collect current generated on the region 21 of the second conductivity type just under the first bus bar electrode 37, for example, even though the contact portion has any shape at other regions.

It is desirable that the ratio of each area of the first contact portion and the second contact portion based on the area of the substrate be about 1% to 6%. For example, when the distance between the finger electrodes is 1.5 mm pitch, the line width will be 14 μm to 90 μm. This is because a back surface electrode (a contact portion) with smaller contact area can increase the passivation region, which allows for increase of the open-circuit voltage.

This contact portion can be formed by screen printing, for example, using a screen plate having an opening with a pattern in a line shape and so on as described above. It can be formed by other procedures using offset printing, inkjet printing, a dispenser, a deposition method, etc.

A specific method for forming contact portion etc. will be described with referring to FIG. 6 (j) and FIG. 7. First, sintering paste is formed on the N-type diffusion layer 20 or the P-type diffusion layer 21 by the foregoing printing method using the foregoing sintering paste as a raw material of the contact portions. Then, the first contact portion 26 or the second contact portion 27 can be formed by baking this sintering paste at a temperature of 700 to 800° C. for 5 to 30 minutes. At this stage, each of the first contact portion 26 joined to the region 20 of the first conductivity type and the second contact portion 27 joined to the region 21 of the second conductivity type is formed so as to have a continuous line shape at least a part thereof (FIG. 7 (1)). As will be described later, in this part having a continuous line shape, the contact portion and the bus bar electrode intersect with each other.

Such a use of the sintering paste containing glass frit allows the glass frit to melt in baking simultaneously with melting of the second backside passivation film 18 and the first backside passivation film 19, and accordingly the electrodes are adhered to the substrate itself so as to directly join to the substrate with penetrating these films. It is to be noted that an n⁺ electrode and a p⁺ electrode (the first contact portion, the second contact portion) can be simultaneously printed and be simultaneously baked. It is also possible to perform the printing and the baking successively.

Then, formation of the insulator film will be described. FIG. 6 (k) is a cross sectional view of a P-type bus bar electrode (a second bus bar electrode), and FIG. 6 (l) is a cross sectional view of an N-type bus bar electrode (a first bus bar electrode). They show cross sectional view taken along the line a-a' and a cross sectional view taken along the line b-b' of the solar cell shown in FIG. 1, respectively.

The insulator films 24 and 25 are formed so as to cover the upper portion and the side portion of the part having a continuous line shape in the first contact portion 26 and the second contact portion 27 (FIG. 7 (2)).

As a material for the insulator film, it is possible to use the foregoing material which contains a resin such as a silicone resin (insulation material). To form this material on a solar cell substrate, it is recommended to use paste material in which solvent is added to give fluidity (insulation paste). When it has fluidity, offset printing, screen printing, a dispenser, etc. can be used.

For example, in order to form a pattern of insulator films as shown in FIG. 7, it is possible to use a screen plate having an opening with the same shape as this pattern. Using this screen plate, the insulator films can be formed by screen printing to apply the insulator paste onto a prescribed position on the N-type silicon substrate 13, and by performing heat treatment at 350° C. or less for 5 to 30 minutes to cure the insulator paste (FIG. 7 (2)). The insulator films may also be formed at desired positions by a method in which the insulator film is formed on the whole surface and then subjected to etching treatment and patterning treatment using photolithography.

Then, a method for forming the first bus bar electrode and the second bus bar electrode will be described. As described above, the production method shown in FIG. 12 is liable to bring the bus bar electrode into contact with the substrate directly to shunt, and is liable to cause generation of bleeding in forming the bus bar electrode (FIG. 13) due to the ruggedness of the substrate surface caused by partial formation of the insulator film, thereby making the electrodes for different conductivity type be connected with each other by the bus bar electrode protruded from the insulator film. These faults lower the parallel resistance of the solar cell to lower the conversion efficiency.

Accordingly, in this step of the present invention, the first bus bar electrode 37 and the second bus bar electrode 38 are formed only on the insulator films 24 and 25. Particularly, when the bus bar electrode is shaped into a rectangle in one continuous body as shown in FIG. 7, the insulator film is formed into a rectangle in one continuous body. That is, the insulator film is formed just under the bus bar electrode. This decreases the ruggedness in the region where the bus bar electrode will be formed. The present invention has a structure in which the bus bar electrode is not in contact with the N-type silicon substrate 13 and the contact portion directly, and the insulator film is inserted therebetween. When the insulator film has a small area, the insulator film and the bus bar electrode have the same shape. In the present invention, it is preferable that the width and the length of the insulator film are larger than those of the bus bar electrode. This makes it possible to separate the bus bar electrode and the substrate more securely. This also decreases the ruggedness in the region where the bus bar electrode will be formed, and accordingly, it is possible to suppress bleeding in forming the bus bar electrode. When forming the bus bar electrode by screen printing, it is desirable to dispose the printing direction to be almost parallel with the longitudinal direction of the bus bar electrode in order to suppress the bleeding in the width direction to the utmost.

Subsequently, the method for forming the first current collector and the second current collector will be described. In this step of the present invention, the first current collector 35 being in electrical contact with the first bus bar electrode 37 is formed on the first contact portion 26, and the second current collector 36 being in electrical contact with the second bus bar electrode 38 is formed on the second contact portion 27 (FIG. 7 (3)).

In this stage, it is preferable that the step for forming the first bus bar electrode and the second bus bar electrode and the step for forming the first current collector and the second current collector be performed simultaneously. This makes it possible to further reduce the number of steps, and to produce a solar cell with high conversion efficiency at lower cost.

Figure 18:
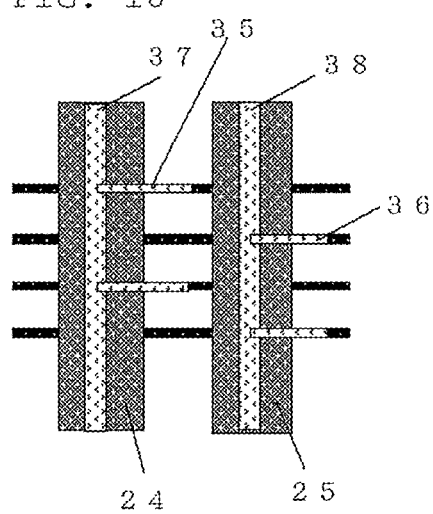
FIG. 18 is an enlarged view showing an enlarged part of the inventive solar cell, to which the solar cell shown in FIG. 2 is modified with regard to the shape of the current collector.
Figure 19:
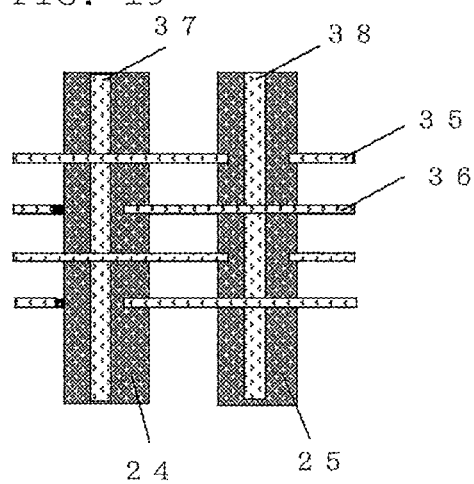
FIG. 19 is an enlarged view showing an enlarged part of the inventive solar cell, to which the solar cell shown in FIG. 2 is modified with regard to the shape of the current collector.
Figure 20:
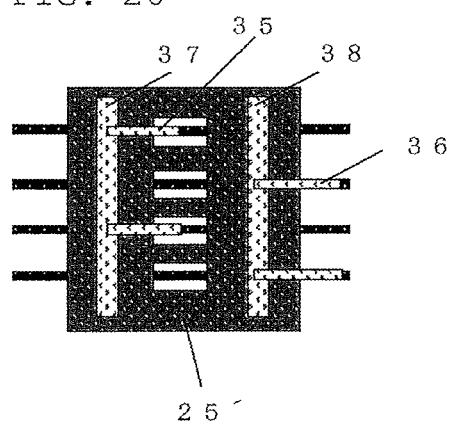
FIG. 20 is a top schematic view showing an example of the inventive solar cell, to which the solar cell shown in FIG. 8 is modified with regard to the shape of the current collector.
Figure 21:
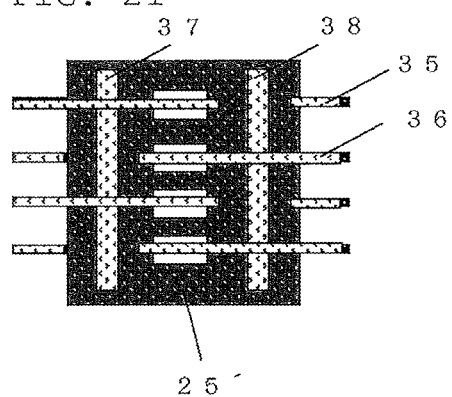
FIG. 21 is a top schematic view showing an example of the inventive solar cell, to which the solar cell shown in FIG. 8 is modified with regard to the shape of the current collector.

When the current collector is formed by using a printing method such as screen printing, the shape (pattern) of the current collector is preferably such shapes as shown in FIGS. 18 to 21. In FIGS. 18 to 21, it is intended to print the current collector from right to left. In general, prints are liable to be bold at the print-end (e.g., the broken lined parts in FIG. 2 and FIG. 8). In this case, if the current collector has such shapes as shown in FIGS. 18 to 21, the print-end of the current collector exists only on the insulator film without existing on the contact portion. Accordingly, these shapes makes it possible to prevent the print for forming a current collector from being bold on the contact portion, and to prevent the line width of the current collector from spreading out from the line width of the contact portion. As a result, it is possible to easily produce a solar cell that is hard to shunt. Incidentally, FIGS. 18 and 19 are enlarged views showing an enlarged part of the inventive solar cell, to which the solar cell shown in FIG. 2 is modified with regard to the shape of the current collector. FIGS. 20 and 21 are top schematic view showing an example of the inventive solar cell, to which the solar cell shown in FIG. 8 is modified with regard to the shape of the current collector.

In this case, the top of the bus bar electrode is soldered with Cu wiring coated with Pb—Sn and so on called tab wiring, and then the solar cell is encapsulated between glass and encapsulant to be a module so as to maintain the power even when it is subjected to outdoor exposure. Accordingly, the bus bar electrode may be whether continuous or discontinuous as long as it has adhesiveness with tab wiring.

As a material for forming the current collector and the bus bar electrode, it is desirable to use the foregoing thermosetting paste which contains one or more kinds of conductive materials selected from the group consisting of Ag, Cu, Au, Al, Zn, In, Sn, Bi, and Pb, and one or more kinds of resins selected from the group consisting of epoxy resins, acrylic resins, polyester resins, phenolic resins, and silicone resins. Because such a thermosetting paste makes it possible to perform heat treatment for forming the electrode at a temperature of less than 400° C., which does not decompose the insulation material, containing organic material suitable for the material of the insulator film.

For example, thermosetting paste having solvent added thereto is applied to a prescribed position by screen printing, and then dried, heated at 350° C. or less for 5 to 30 minutes to be cured. In this method, the thermosetting paste does not contain glass frit unlike sintering paste of the raw material of the contact portion. Accordingly, the electrode material (the thermosetting paste) does not directly join to the silicon substrate in heating, and the increase of contact area is suppressed. It is also possible to use such thermosetting resin paste to bond the tub wiring and the bus bar portion followed by heat treatment. This makes it possible to adhere the tab wiring and the bus bar portion without soldering.

EXAMPLES

Hereinafter, the present invention will be described in more detail with reference to Example and Comparative Example, but the present invention is not limited this Example.

Example and Comparative Example

In order to confirm the validity of the present invention, the following steps were performed on 100 pieces of semiconductor substrates (50 pieces for each of Example 1 and Comparative Example 1) to produce 100 pieces of solar cells. Each of these was provided with three pairs of bus bar electrodes.

As shown in FIG. 6, first, on the backside of an N-type silicon substrate 13 of 15 cm square with a thickness of 200 μm, a silicon nitride film of 200 nm was formed by a CVD method to be a texture mask 31 (FIG. 6 (a)). Subsequently, on the light-receiving surface of the N-type silicon substrate 13, texture structure (a rugged shape) 14 was formed with a solution in which isopropyl alcohol had been added to aqueous potassium hydroxide solution (FIG. 6 (b)).

Subsequently, the texture mask 31 formed on the backside of the N-type silicon substrate 13 was removed with hydrofluoric acid solution, and then silicon oxide films were formed on the light-receiving surface and the backside of the N-type silicon substrate 13 as diffusion masks 32 and 33 by thermal oxidation. To the portions to be formed an N-type diffusion layer, etching paste mainly composed of phosphoric acid was applied by screen printing. The diffusion mask 32 was removed at the portion to be formed an N-type diffusion layer by heat treatment to expose the substrate (FIG. 6 (c)). The etching paste after the patterning treatment was subjected to ultrasonic cleaning and removed by acid treatment. Thereafter, to the exposed portion on the backside of the N-type silicon substrate 13, phosphorous as an N-type impurity was diffused by vapor-phase diffusion using POCl$_3$ to form an N-type diffusion layer 20 (FIG. 6 (c)).

Subsequently, hydrofluoric acid treatment was performed to remove the diffusion mask 32 and the diffusion mask 33 formed on the N-type silicon substrate 13, as well as glass layers formed by diffusion of phosphorous into the diffusion masks 32 and 33, and then thermal oxidation with oxygen was performed to form a silicon oxide film 34 (FIG. 6 (d)). Then, the silicon oxide film 34 was removed at a portion to be formed a P-type diffusion layer 21 on the backside by etching (FIG. 6 (e)).

The backside of the N-type silicon substrate 13 was spin coated with an aqueous solution containing boric acid, and after drying, subjected to heat treatment to diffuse boron as a P-type impurity into the exposed portion on the backside of the N-type silicon substrate 13, thereby forming a P-type diffusion layer 21 (FIG. 6 (f)).

Subsequently, as steps corresponding to FIG. 6 (*g*) to (*i*), hydrofluoric acid treatment was performed to remove the silicon oxide film 34 formed on the N-type silicon substrate 13, and a glass layer formed by diffusion of boron into the silicon oxide film 34, and then silicon nitride films were formed on the front surface and the backside as passivation films by a CVD method. The procedures to this step were performed in each of Example 1 and Comparative Example 1 as common steps. Afterward, formation of electrodes was performed.

Example 1

In Example 1, contact portions, insulator films, current collectors, and bus bar electrodes were formed in a pattern shown in FIGS. 2 and 7 (FIG. 6 (*j*) to (*l*)).

First, contact portions were formed in a pattern of line shapes each having a width of 100 μm. Specifically, conductive paste (sintering paste) composed of Ag particles, glass frit, binder, and solvent was applied onto prescribed portions on the diffusion layer by screen printing. This was dried, and baked at 700° C. for 5 minutes to form first contact portions 26 and second contact portions 27. Then, insulator films each having a width of 3 mm (in the longitudinal direction of the finger electrode) and a length of 150 mm (in the longitudinal direction of the bus bar electrode) were formed just under the bus bar electrodes so as to intersect with the finger electrodes (contact portions) at right angles. As the raw material for the insulator films, polyimide paste was used. This paste was applied onto prescribed parts by screen printing, and heated at 150° C. for 20 minutes to cure, thereby forming insulator films.

Then, current collectors each having a width of 100 μm and bus bar electrodes each having a width of 1.2 mm and a length of 148 mm were formed simultaneously. As the raw material for the current collectors and the bus bar electrodes, conductive paste (thermosetting paste) composed of Ag particles and thermosetting resin was used. This thermosetting paste was applied by screen printing, dried, and heated at 200° C. for 30 minutes to cure, thereby forming the first current collectors 35, the second current collectors 36, the first bus bar electrodes 37, and the second bus bar electrodes 38 simultaneously.

Comparative Example 1

In Comparative Example 1, contact portions, insulator films, current collectors, and bus bar electrodes were formed in a pattern shown in FIGS. 9 and 12.

First, contact portions were formed in a pattern of line shapes each having a width of 100 μm. Specifically, conductive paste (sintering paste) composed of Ag particles, glass frit, binder, and solvent was applied onto prescribed portions on the diffusion layer by screen printing. This was dried, and baked at 700° C. for 5 minutes to form first contact portions 126 and second contact portions 127. Then, insulator films each having a length of 3 mm (in the longitudinal direction of the finger electrode) and a width of 500 μm (in the longitudinal direction of the bus bar electrode) were formed only to insulation regions (the region where the finger electrode and the bus bar electrode for different conductivity type intersects with each other). As the raw material for the insulator films, polyimide paste was used. This paste was applied onto prescribed parts by screen printing, and heated at 150° C. for 20 minutes to cure, thereby forming insulator films.

Then, current collectors each having a width of 100 μm and bus bar electrodes each having a width of 1.2 mm and a length of 148 mm were formed simultaneously. As the raw material for the current collectors and the bus bar electrodes, conductive paste (thermosetting paste) composed of Ag particles and thermosetting resin was used. This thermosetting paste was applied by screen printing, dried, and heated at 200° C. for 30 minutes to cure, thereby forming the first current collectors 135, the second current collectors 136, the first bus bar electrodes 137, and the second bus bar electrodes 138 simultaneously.

The 100 pieces of solar cells thus produced was evaluated by using a solar simulator (in an atmosphere of 25° C., light intensity 1 kW/m$^2$, spectrum AM1.5 global). The parallel resistance of each solar cell was also measured. The results are shown in Table 1. Table 1 shows the proportions of the substrates with the parallel resistance being more than 1000 Ωcm$^2$. The conversion efficiency in Table 1 shows each average of 50 pieces of solar cells of Example 1 and Comparative Example 1.

TABLE 1

|  |  | Comparative Example 1 | Example 1 |
|---|---|---|---|
| Parallel resistance | Proportion of >1000 Ωcm$^2$ (%) | 40 | 96 |
| Conversion efficiency | % | 18.0 | 19.6 |

Table 1 is a table showing the experimental results of Example 1 and Comparative Example 1. As shown in Table 1, Comparative Example 1 gave solar cells having a parallel resistance of 1000 Ωcm$^2$ or less in high proportion, and the conversion efficiency was largely lowered. On the other hand, Example 1 gave solar cells with sufficiently high parallel resistance and high conversion efficiency. This is because the insulation films were formed in the whole area just under the bus bar electrodes, and the bus bar electrodes were not in contact with the substrate directly thereby. This is also due to flatness of the surfaces of the insulator films (regions where the bus bar electrodes were formed), which could suppress bleeding in forming the bus bar electrodes, and accordingly, the first finger electrodes and the second finger electrodes were not in contact with the second bus bar electrodes and the first bas bar electrodes respectively.

It is to be noted that the present invention is not limited to the foregoing embodiment. The embodiment is just an exemplification, and any examples that have substantially the same feature and demonstrate the same functions and effects as those in the technical concept described in claims of the present invention are included in the technical scope of the present invention.

The invention claimed is:
1. A solar cell comprising:
  a semiconductor substrate of a first conductivity type comprising main surfaces that are opposite to each other wherein one of the main surfaces is a light-receiving surface, the other main surface is a backside, and the backside of the semiconductor substrate has a region of the first conductivity type and a region of a second conductivity type, being an opposite conductivity type to the first conductivity type;

a first finger electrode composed of a first contact portion joined to the region of the first conductivity type and a first current collector formed on the first contact portion;
a second finger electrode composed of a second contact portion joined to the region of the second conductivity type and a second current collector formed on the second contact portion;
a first bus bar electrode being in electrical contact with the first current collector;
a second bus bar electrode being in electrical contact with the second current collector;
a first insulator film disposed at least in the whole area just under the first bus bar electrode; and
a second insulator film disposed at least in the whole area just under the second bus bar electrode;
wherein the entire area of the first bus bar electrode is disposed on the first insulator film;
the entire area of the second bus bar electrode is disposed on the second insulator film;
the electrical contact between the first current collector and the first bus bar electrode is made on the first insulator film;
the electrical contact between the second current collector and the second bus bar electrode is made on the second insulator film;
the first contact portion is in a continuous line shape at least just under the second insulator film; and
the second contact portion is in a continuous line shape at least just under the first insulator film.

2. The solar cell according to claim 1, wherein the first bus bar electrode and the second bus bar electrode are each in a continuous line shape, and the insulator film is in a continuous line shape.

3. The solar cell according to claim 2, wherein the total number of the first bus bar electrode and the second bus bar electrode is 4 or more and 10 or less.

4. The solar cell according to claim 3, wherein the insulator film is composed of a material which contains one or more resins selected from the group consisting of silicone resins, polyimide resins, polyamide-imide resins, fluororesins, phenolic resins, melamine resins, urea resins, polyurethanes, epoxy resins, acrylic resins, polyester resins, and poval resins.

5. The solar cell according to claim 4, wherein the insulator film has a thickness of 1 to 60 μm.

6. The solar cell according to claim 3, wherein the insulator film has a thickness of 1 to 60 μm.

7. The solar cell according to claim 2, wherein the insulator film is composed of a material which contains one or more resins selected from the group consisting of silicone resins, polyimide resins, polyamide-imide resins, fluororesins, phenolic resins, melamine resins, urea resins, polyurethanes, epoxy resins, acrylic resins, polyester resins, and poval resins.

8. The solar cell according to claim 7, wherein the insulator film has a thickness of 1 to 60 μm.

9. The solar cell according to claim 2, wherein the insulator film has a thickness of 1 to 60 μm.

10. The solar cell according to claim 1, wherein the total number of the first bus bar electrode and the second bus bar electrode is 4 or more and 10 or less.

11. The solar cell according to claim 10, wherein the insulator film is composed of a material which contains one or more resins selected from the group consisting of silicone resins, polyimide resins, polyamide-imide resins, fluororesins, phenolic resins, melamine resins, urea resins, polyurethanes, epoxy resins, acrylic resins, polyester resins, and poval resins.

12. The solar cell according to claim 11, wherein the insulator film has a thickness of 1 to 60 μm.

13. The solar cell according to claim 10, wherein the insulator film has a thickness of 1 to 60 μm.

14. The solar cell according to claim 1, wherein the insulator film is composed of a material which contains one or more resins selected from the group consisting of silicone resins, polyimide resins, polyamide-imide resins, fluororesins, phenolic resins, melamine resins, urea resins, polyurethanes, epoxy resins, acrylic resins, polyester resins, and poval resins.

15. The solar cell according to claim 14, wherein the insulator film has a thickness of 1 to 60 μm.

16. The solar cell according to claim 1, wherein the insulator film has a thickness of 1 to 60 μm.

17. The solar cell according to claim 1, wherein the first current collector, the second current collector, the first bus bar electrode, and the second bus bar electrode are each composed of a material which contains one or more kinds of conductive materials selected from the group consisting of Ag, Cu, Au, Al, Zn, In, Sn, Bi, and Pb, and one or more kinds of resins selected from the group consisting of epoxy resins, acrylic resins, polyester resins, phenolic resins, and silicone resins.

18. A method for producing a solar cell including a semiconductor substrate of a first conductivity type comprising main surfaces that are opposite to each other wherein one of the main surfaces of the semiconductor substrate is a light-receiving surface, the other main surface is a backside, and the backside of the semiconductor substrate has a region of the first conductivity type and a region of a second conductivity type, being an opposite conductivity type to the first conductivity type; comprising the steps of:
forming the region of the first conductivity type and the region of the second conductivity type on the backside;
forming a first contact portion joined to the region of the first conductivity type and a second contact portion joined to the region of the second conductivity type such that each of them has a continuous line shape at least in a part thereof;
forming a second insulator film so as to cover the upper portion and the side portion of the part having a continuous line shape in the first contact portion and a first insulator film so as to cover the upper portion and the side portion of the part having a continuous line shape in the second contact portion;
forming a first bus bar electrode and a second bus bar electrode so that the first insulator film is disposed at least in the whole area just under the first bus bar electrode and the second insulator film is disposed at least in the whole area just under the second bus bar electrode and the entire area of the first bus bar electrode is disposed on the first insulator film and the entire area of the second bus bar electrode is disposed on the second insulator film;
forming a first current collector being in electrical contact with the first bus bar electrode on the first contact portion; and
forming a second current collector being in electrical contact with the second bus bar electrode on the second contact portion.

19. The method for producing a solar cell according to claim 18, wherein the step for forming a first bus bar electrode and a second bus bar electrode and the step for forming a first current collector and a second current collector are performed simultaneously.

* * * * *